US012796462B2

(12) United States Patent
Wang et al.

(10) Patent No.: US 12,796,462 B2
(45) Date of Patent: Nov. 10, 2026

(54) HEAT DISSIPATION STRUCTURE OF COOLING PLATE FOR POWER SEMICONDUCTOR MODULE

(71) Applicant: ZHENGHAI GROUP CO., LTD., Yantai (CN)

(72) Inventors: Changcheng Wang, Yantai (CN); Yusheng Tang, Yantai (CN); Xianye Mao, Yantai (CN); Jianwen Guo, Yantai (CN)

(73) Assignee: ZHENGHAI GROUP CO., LTD., Yantai (CN)

( * ) Notice: Subject to any disclaimer, the term of this patent is extended or adjusted under 35 U.S.C. 154(b) by 838 days.

(21) Appl. No.: 18/028,512

(22) PCT Filed: Oct. 26, 2021

(86) PCT No.: PCT/CN2021/126306
§ 371 (c)(1),
(2) Date: Mar. 24, 2023

(87) PCT Pub. No.: WO2022/095750
PCT Pub. Date: May 12, 2022

(65) Prior Publication Data

US 2024/0030090 A1 Jan. 25, 2024

(30) Foreign Application Priority Data

Nov. 6, 2020 (CN) ......................... 202011230363.6

(51) Int. Cl.
*H10W 40/22* (2026.01)
*H10W 90/00* (2026.01)
(Continued)

(52) U.S. Cl.
CPC ........ *H10W 40/228* (2026.01); *H10W 40/231* (2026.01); *H10W 40/40* (2026.01); *H10W 90/734* (2026.01)

(58) Field of Classification Search
None
See application file for complete search history.

(56) References Cited

U.S. PATENT DOCUMENTS 10,015,907 B2 7/2018 Wu et al.
2006/0096742 A1 * 5/2006 Bhatti ................ F28D 15/0266 257/E23.098

(Continued)

FOREIGN PATENT DOCUMENTS

CN 1725479 A 1/2006
CN 103697749 A 4/2014

(Continued)

OTHER PUBLICATIONS

First Office Action dated Aug. 24, 2023 for Japanese patent application No. 2022-543069, English translation provided by Global Dossier.

(Continued)

*Primary Examiner* — Brent A. Fairbanks
*Assistant Examiner* — Michael Anguiano
(74) *Attorney, Agent, or Firm* — Yue (Robert) Xu; Apex Attorneys at Law, LLP

(57) ABSTRACT

A heat dissipation structure of a cooling plate for a power semiconductor module includes a power chip, a first solder layer, a copper-clad ceramic substrate, a second solder layer and a cooling plate body. The power chip, the first solder layer, the copper-clad ceramic substrate, the second solder layer and the cooling plate body arranged sequentially from top to bottom. The heat dissipation structure further includes a straight rib mechanism arranged on a bottom surface of the (Continued)

cooling plate body, and a pin rib mechanism arranged on a surface of the straight rib mechanism.

6 Claims, 10 Drawing Sheets

(51) Int. Cl.
*H10W 40/20* (2026.01)
*H10W 40/40* (2026.01)

(56) References Cited

U.S. PATENT DOCUMENTS

| | | | | |
|---|---|---|---|---|
| 2008/0066888 | A1* | 3/2008 | Tong | F28F 13/12 165/80.3 |
| 2009/0145581 | A1 | 6/2009 | Hoffman et al. | |
| 2011/0297361 | A1* | 12/2011 | Carbone | H10W 40/10 165/185 |
| 2017/0020027 | A1 | 1/2017 | Gao et al. | |
| 2017/0280588 | A1* | 9/2017 | Wu | H05K 7/20254 |
| 2019/0189548 | A1* | 6/2019 | Ohashi | B23K 35/22 |
| 2021/0215433 | A1* | 7/2021 | Takabayashi | F28D 15/0275 |
| 2021/0289666 | A1* | 9/2021 | Favre | H05K 7/20418 |

FOREIGN PATENT DOCUMENTS

| | | | | |
|---|---|---|---|---|
| CN | 104807362 | A | 7/2015 | |
| CN | 105188307 | A | 12/2015 | |
| CN | 207967049 | U | 10/2018 | |
| CN | 110220402 | A | 9/2019 | |
| CN | 112466825 | A | 3/2021 | |
| EP | 0253126 | A1 * | 1/1988 | H10W 40/228 |
| EP | 1926143 | A1 | 5/2008 | |
| EP | 3460838 | A1 | 3/2019 | |
| JP | 2001148450 | A | 5/2001 | |
| JP | 2007273529 | A | 10/2007 | |
| JP | 2012248576 | A | 12/2012 | |
| JP | 2016004828 | A | 1/2016 | |
| JP | 2017224768 | A | 12/2017 | |
| WO | 2019116910 | A1 | 6/2019 | |

OTHER PUBLICATIONS

International Search Report for PCT/CN2021/126306 mailed Jan. 26, 2022, ISA/CN.

The European Search Report issued on Sep. 4, 2024 for the European counterpart application No. 21888447.6.

* cited by examiner

HEAT DISSIPATION STRUCTURE OF COOLING PLATE FOR POWER SEMICONDUCTOR MODULE

This application is the national phase of International Patent Application No. PCT/CN2021/126306, titled "HEAT DISSIPATION STRUCTURE OF COOLING PLATE FOR POWER SEMICONDUCTOR MODULE", filed on Oct. 26, 2021, which claims priority to Chinese Patent Application No. 202011230363.6, titled "HEAT DISSIPATION STRUCTURE OF COOLING PLATE FOR POWER SEMICONDUCTOR MODULE", filed on Nov. 6, 2020 with the China National Intellectual Property Administration, both of which are incorporated herein by reference in their entireties.

FIELD

The present disclosure relates to the technical field of cooling of power devices, and in particular to a heat dissipation structure of a cooling plate for a power semiconductor module.

BACKGROUND

A power semiconductor module is an integrated module in which power electronic components are assembled based on certain functions. The power semiconductor module has advantages of small size and high-power density, and thus has a wide range of applications in the field of new energy vehicles. With the development of the new energy vehicles towards high power and long battery life, application environment of the power semiconductor module becomes increasingly severe, and reliability of the power semiconductor module has attracted widespread attention.

Thermal reliability is an important part of the reliability of the power semiconductor module and the power semiconductor module has to show good heat dissipation performance in terms of the thermal reliability. The heat in the power semiconductor module mainly comes from a chip, a copper layer and a busbar terminal. The heat generated by the chip and the copper layer is mainly transferred via a copper-clad ceramic substrate to a cooling plate, and finally is transferred out of the power semiconductor module by coolant. It can be seen that a heat dissipation structure of the cooling plate is particularly important for the heat dissipation of the power semiconductor module.

There are three basic ways of heat transfer, namely, heat conduction, heat convection and heat radiation. In a heat dissipation process of the power semiconductor module, the heat is dissipated mainly through the convective heat transfer between the cooling plate and the coolant.

Convective heat transfer is a combination of heat transfer caused by the macroscopic flow of fluid and heat transfer caused by the thermal conduction of molecules in the fluid. To illustrate this phenomenon, steady-state heat transfer through a flat plate is taken as an example, as shown in FIG. 1. Assuming that a temperature of the incoming coolant is lower than a temperature of the cooling plate 1, a flow velocity v in a thin fluid layer close to a wall of the cooling plate 1 gradually decreases, and finally the fluid on the wall is stagnant and fails to flow freely due to viscosity of the fluid. In this case, due to the heat conduction of molecules in the fluid, the amount of heat $Q_1$ is transferred from a surface of the plate to the fluid so that the fluid is heated. The heated fluid moves forward and carries away the amount of heat $Q_2$. Therefore, the amount of heat $Q_1$ to be transferred by the molecules in the fluid in a direction perpendicular to the surface of the plate gradually decreases, as indicated by a dashed arrow in FIG. 1. Since the heat transferred from the wall of the cooling plate 1 to the fluid has been all carried away by the moving fluid at the outer boundary of the thin fluid layer, a rate of change in the temperature of the fluid in the direction perpendicular to the surface of the plate approximates zero, and thus the thermal conductivity of the molecules in the fluid in the direction perpendicular to the surface of the plate is also zero. A dotted arrow in FIG. 1 represents the amount of heat $Q_1$ transferred by the heat conduction of the molecules in a direction perpendicular to the flow direction of the surface of the plate, and a width of the arrow represents magnitude of the heat flow. A thick solid arrow represents the amount of heat $Q_2$ carried away by the fluid, and a width of the arrow represents magnitude of the heat flow. v represents the main flow velocity of the fluid and a thin solid arrow indicates magnitude and a direction of v.

The Equation for convective heat transfer is as follows:

$$\Phi = hA(T_w - T_f) = hA\Delta T \tag{1}$$

In the Equation, Φ represents the amount of heat carried away by the convective heat transfer between the cooling plate and the coolant, in the unit of W, $T_w$ and $T_f$ represent an average temperature of a solid wall and an average temperature of a liquid wall at an interface between fluid and solid, respectively, in the unit of K. h is a convective heat transfer coefficient in the unit of $W/(m^2 \cdot K)$. A represents a convective heat transfer area in the unit of $m^2$, and ΔT represents a temperature difference between $T_w$ and $T_f$, in the unit of K.

It can be seen from Equation (1) that the heat carried away by the convective heat transfer may be increased by increasing the convective heat transfer coefficient, the heat transfer area and the temperature difference. The convective heat transfer coefficient is related to multiple factors such as the velocity, density, dynamic viscosity and specific heat capacity of the coolant and the thermal conductivity coefficient of the cooling plate. The heat exchange area is related to the heat dissipation structure of the cooling plate. The temperature difference is related to process technology.

Researches on fluid mechanics have shown that there are two different flow regimes, i.e., laminar flow and turbulent flow, for viscous fluid. In laminar flow, the fluid micelles flow in regular layers along the flow direction, as shown by the thin solid arrow in FIG. 1. In turbulent flow, in addition to the movement in the flow direction, the fluid micelles also pulsate irregularly. When the fluid micelles pulsate from one position to another, vigorous mixing occurs between the various parts of the fluid micelles, thus producing two effects: additional momentum exchange occurs between the fluids in the layers at different flow velocities, and additional heat exchange occurs between the fluids in the layers at different temperatures. According to the convective heat transfer theory, the convective heat transfer coefficient in laminar flow is smaller than that in turbulent flow given other conditions are the same, and it can be seen that the heat carried away by the turbulent flow is greater than that carried away by the laminar flow.

In most cases, the bottom of the cooling plate 1 of a common power semiconductor module is in a flat plate, as shown in FIG. 1. Alternatively, the bottom is formed by a flat plate and pin ribs 2, and the pin ribs 2 are arranged at intervals on the bottom of the cooling plate 1 as shown in FIG. 2. The viscous fluid at the interface between fluid and solid shown in FIG. 1 is completely in laminar flow. Although the fluid at the interface fluid and solid shown in FIG. 2 is partially in the turbulent flow, only few fluid micelles are in turbulent flow, and the majority fluid micelles are still in the laminar flow. With reference to Equation (1), it can be seen that the heat dissipation structure of the cooling plate shown in FIGS. 1 and 2 does not substantially change the type of fluid flow at the interface between fluid and solid, and thus the convective heat transfer coefficient h does not substantially increase. Only the convective heat transfer area A is increased and the heat dissipation capacity is not significantly enhanced in FIG. 2 when compared with FIG. 1.

With the increasing severe application environment of the power semiconductor module, common heat dissipation structure of the cooling plate fails to meet the requirements of heat dissipation, which seriously affects the thermal reliability of the power semiconductor module, resulting in a reduction in the overall performance and service life of the power semiconductor module.

SUMMARY

The technical problem to be solved by the present disclosure is to provide a heat dissipation structure of a cooling plate for a power semiconductor module. The use of the heat dissipation structure overcomes the defects of a traditional flat-plate cooling plate, effectively improves the convective heat transfer coefficient and heat dissipation area of an interface between fluid and solid, and increases heat transferred by macroscopic flow of fluid and heat transferred by the heat conduction of molecules in the fluid. Therefore, the heat dissipation performance of the power semiconductor module is enhanced and the thermal reliability and service life of the power semiconductor module are improved.

In order to solve the above technical problems, the heat dissipation structure of the cooling plate for the power semiconductor module according to the present disclosure includes a power chip, a first solder layer, a copper-clad ceramic substrate, a second solder layer and a cooling plate body arranged sequentially from top to bottom. The heat dissipation structure further includes a straight rib mechanism arranged on a bottom surface of the cooling plate body and a pin rib mechanism arranged on a surface of the straight rib mechanism.

Further, the straight rib mechanism includes multiple straight ribs arranged on the bottom surface of the cooling plate body, and each of the multiple straight ribs has a cross-section that is triangular, convex arc-shaped or concave arc-shaped.

Further, the arrangement of the multiple straight ribs on the bottom surface of the cooling plate body is of no gaps or is spaced.

Further, the multiple straight ribs on the bottom surface of the cooling plate body is arranged at an angle of 0 to 90 degrees relative to a flow direction of coolant.

Further, the pin rib mechanism includes multiple pin ribs arranged on rib bases, rib tops or side surfaces of the multiple straight ribs, and each of the multiple pin ribs is circular, elliptical or polygonal in cross-section, Further, the multiple pin ribs are arranged in a straight line along the flow direction of the coolant. Alternatively, the multiple pin ribs are staggered along the flow direction of the coolant, Further, the multiple pin ribs are arranged in at least one row between adjacent rib bases or adjacent rib tops of the multiple straight ribs.

Because the heat dissipation structure of the cooling plate of the power semiconductor module according to the present disclosure adopts the above technical solutions, that is, the heat dissipation structure includes a power chip, a first solder layer, a copper-clad ceramic substrate, a second solder layer and a cooling plate body arranged sequentially from top to bottom. The heat dissipation structure further includes a straight rib mechanism arranged on a bottom surface of the cooling plate body, and a pin rib mechanism arranged on a surface of the straight rib mechanism. The use of the heat dissipation structure overcomes the defects of a traditional flat cooling plate, effectively improves the convective heat transfer coefficient and heat dissipation area of an interface between fluid and solid, and increases heat transferred by macroscopic flow of fluid and heat transferred by the heat conduction of molecules in the fluid. Therefore, the heat dissipation performance of the power semiconductor module is enhanced and the thermal reliability and service life of the power semiconductor module are improved.

BRIEF DESCRIPTION OF THE DRAWINGS

The present disclosure is further described in detail in conjunction with the accompanying drawings and embodiments below. In the drawings.

DETAILED DESCRIPTION

Figure 1:
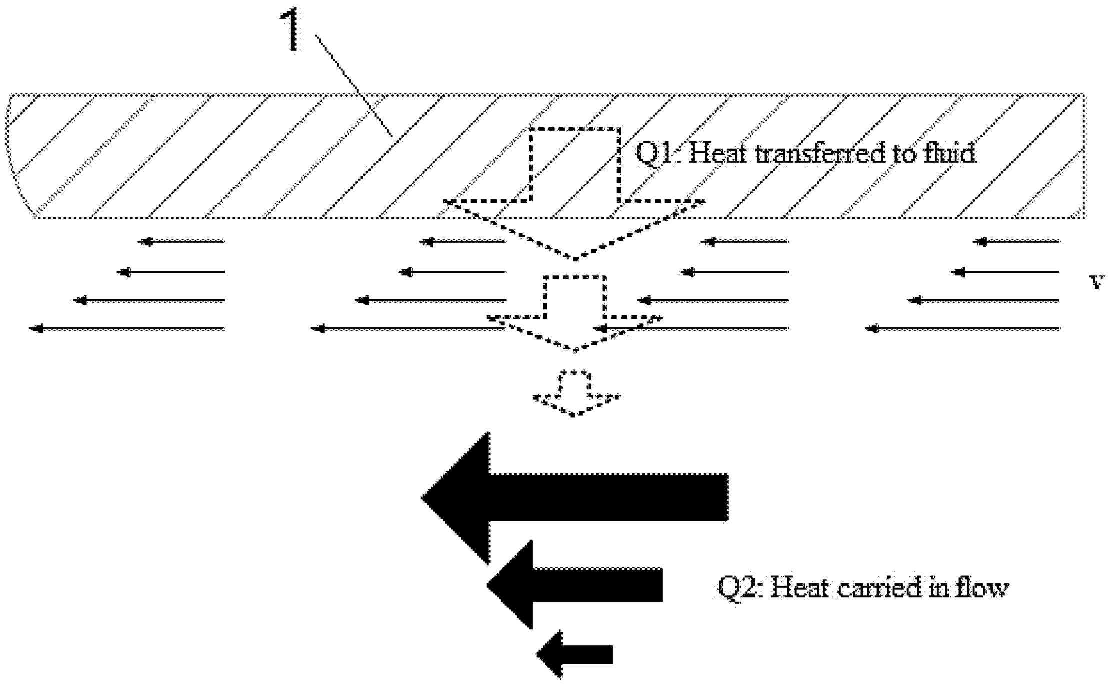
FIG. 1 is a schematic diagram illustrating heat dissipation mechanism of a flat cooling plate.
Figure 2:
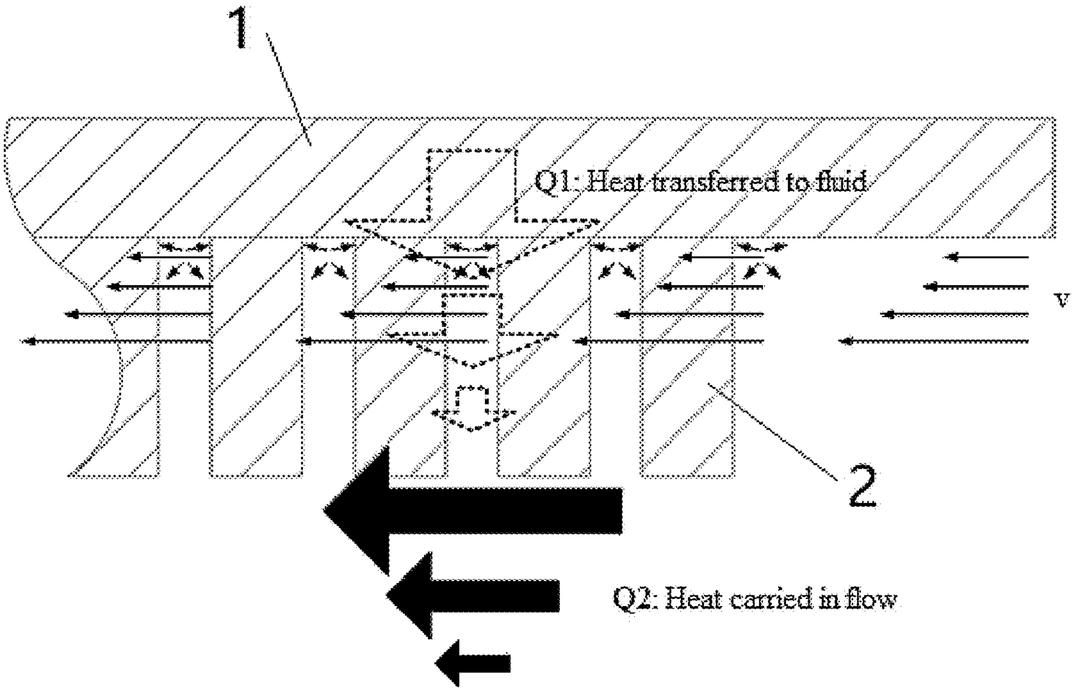
FIG. 2 is a schematic diagram illustrating heat dissipation mechanism of a flat cooling plate with pin ribs at the bottom.
Figure 3:
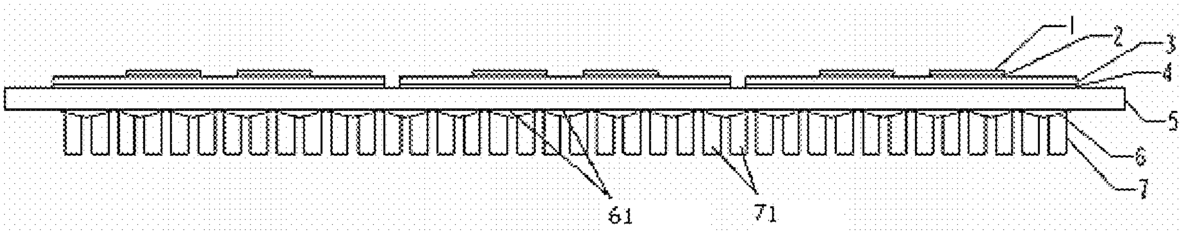
FIG. 3 is a schematic diagram illustrating a heat dissipation structure of a cooling plate for a power semiconductor module according to the present disclosure.
Figure 4:
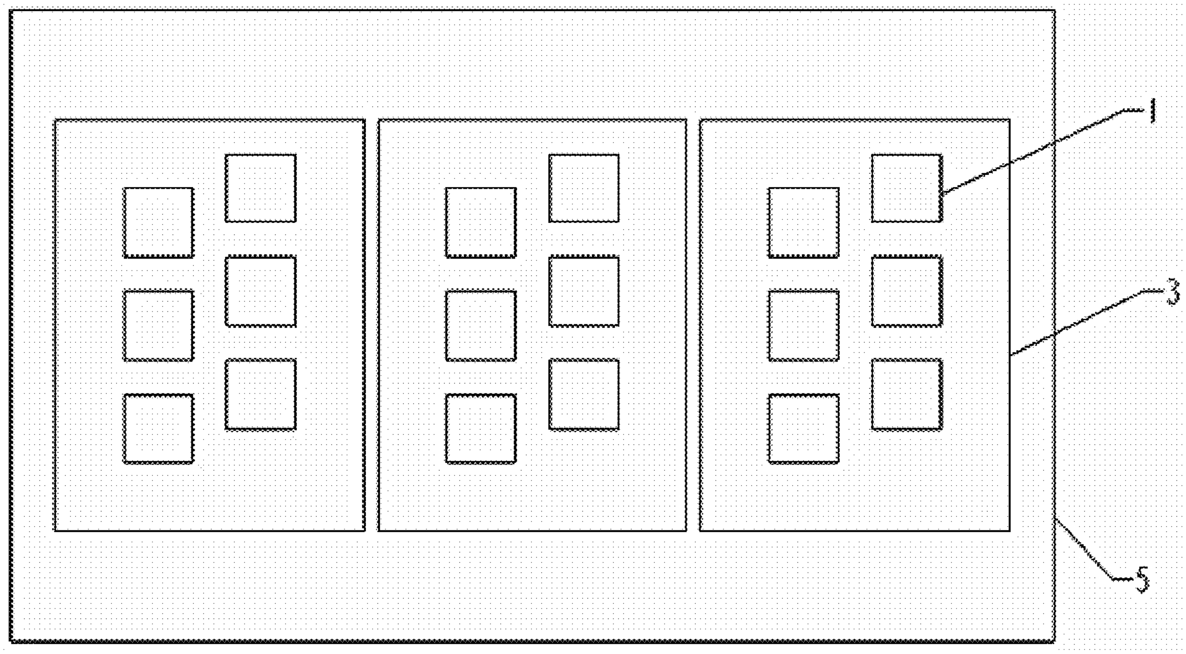
FIG. 4 is a top view of the heat dissipation structure in FIG. 3.
Figure 5:
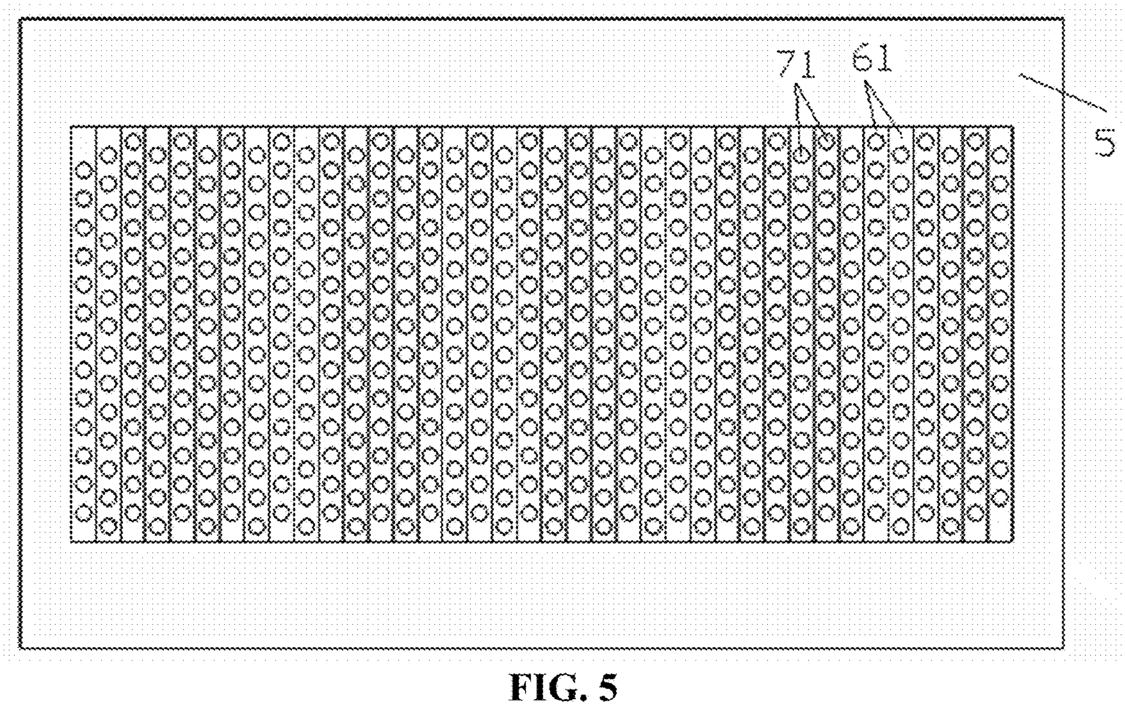
FIG. 5 is a bottom view of the heat dissipation structure in FIG. 3.
Figure 6:
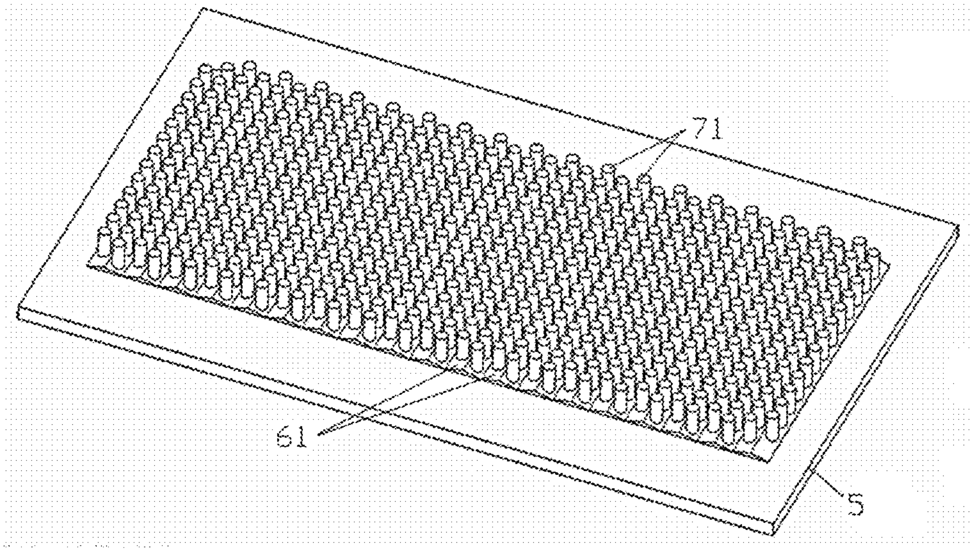
FIG. 6 is an axonometric view of the heat dissipation structure.

In the embodiments as shown in FIGS. 3, 4, 5 and 6, a heat dissipation structure of a cooling plate for a power semiconductor module according to the present disclosure includes a power chip 1, a first solder layer 2, a copper-clad ceramic substrate 3, a second solder layer 4 and a cooling plate body 5 arranged sequentially from top to bottom. The heat dissipation structure further includes a straight rib mechanism 6 arranged on a bottom surface of the cooling plate body 5, and a pin rib mechanism 7 arranged on a surface of the straight rib mechanism 6.

Preferably, the straight rib mechanism 6 includes multiple straight ribs 61 arranged on the bottom surface of the cooling plate body 5, and each of the multiple straight ribs 61 has a cross-section that is triangular, convex arc-shaped or concave arc-shaped.

Preferably, the arrangement of the multiple straight ribs 61 on the bottom surface of the cooling plate body 5 is of no gaps or is spaced.

Preferably, the multiple straight ribs 61 on the bottom surface of the cooling plate body 5 is arranged at an angle of 0 to 90 degrees relative to a flow direction of coolant.

Preferably, the pin rib mechanism 7 includes multiple pin ribs 71 arranged on rib bases, rib tops and side surfaces of the multiple straight ribs 61, and each of the multiple pin ribs 71 is circular, elliptical or polygonal in cross-section.

Preferably, the multiple pin ribs 71 are distributed in a straight line or are staggered along the flow direction of the coolant.

Preferably, the multiple pin ribs 71 are arranged in at least one row between adjacent rib bases or adjacent rib tops of the multiple straight ribs 61.

Figure 7:
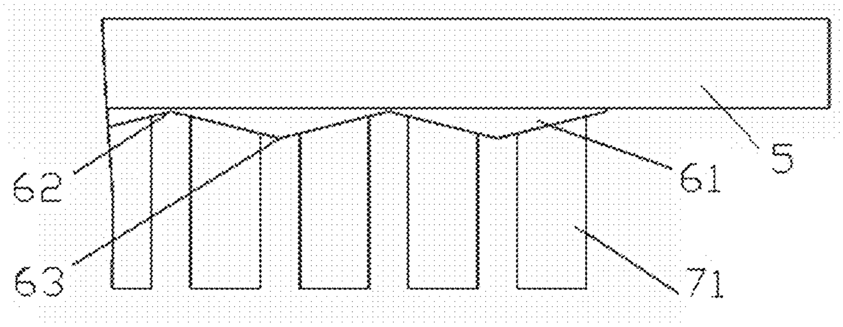
FIG. 7 is a schematic diagram illustrating a first arrangement of straight ribs and pin ribs in the heat dissipation structure.

As shown in FIG. 7, the straight ribs 61 of the cooling structure are triangular in cross-section and are arranged without gaps on the bottom surface of the cooling plate body 5 along the extending direction. The pin rib 71 is arranged on a side surfaces of the straight rib 61, i.e., between a rib base 62 and a rib top 63 of the straight rib 61.

Figure 8:
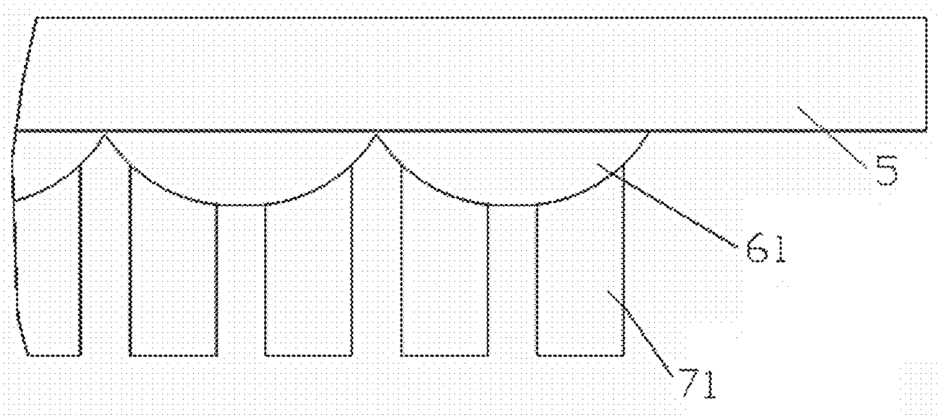
FIG. 8 is a schematic diagram illustrating a second arrangement of straight ribs and pin ribs in the heat dissipation structure.

As shown in FIG. 8, the straight ribs 61 of the cooling structure are convex arc-shaped in cross-section and are arranged without gaps on the bottom surface of the cooling plate body 5 along the extending direction. The pin rib 71 is arranged on a side of a convex surface.

Figure 9:
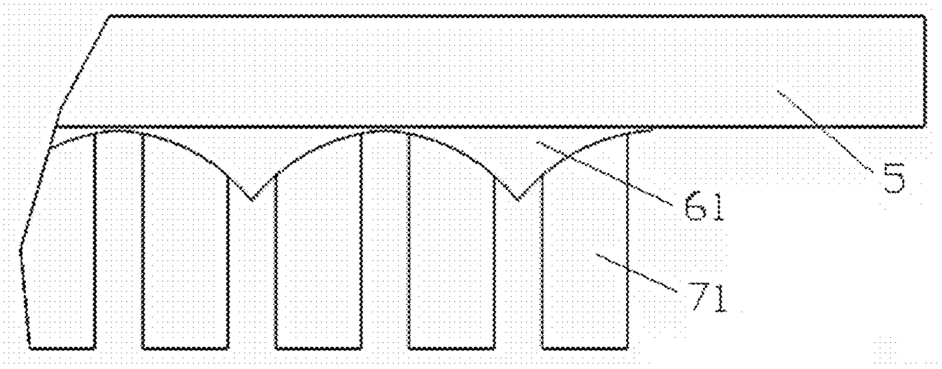
FIG. 9 is a schematic diagram illustrating a third arrangement of straight ribs and pin ribs in the heat dissipation structure.

As shown in FIG. 9, the straight ribs 61 of the cooling structure are concave arc-shaped in cross-section and are arranged without gaps on the bottom surface of the cooling plate body 5 along the extending direction. The pin rib 71 is arranged on an inner side of a convex surface.

Figure 10:
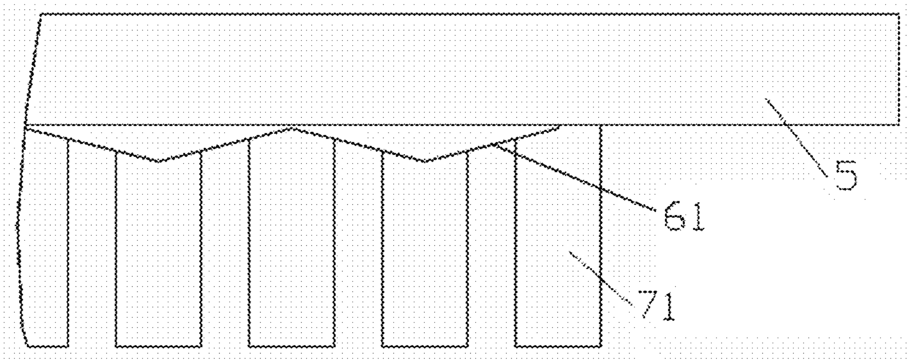
FIG. 10 is a schematic diagram illustrating a fourth arrangement of straight ribs and pin ribs in the heat dissipation structure.

As shown in FIG. 10, the straight ribs 61 of the cooling structure are triangular in cross-section and are arranged without gaps on the bottom surface of the cooling plate body 5 along the extending direction. A pin rib 71 is arranged on a rib base of the straight rib 61, and another pin rib 71 is arranged on a rib top of the straight rib 61.

Figure 11:
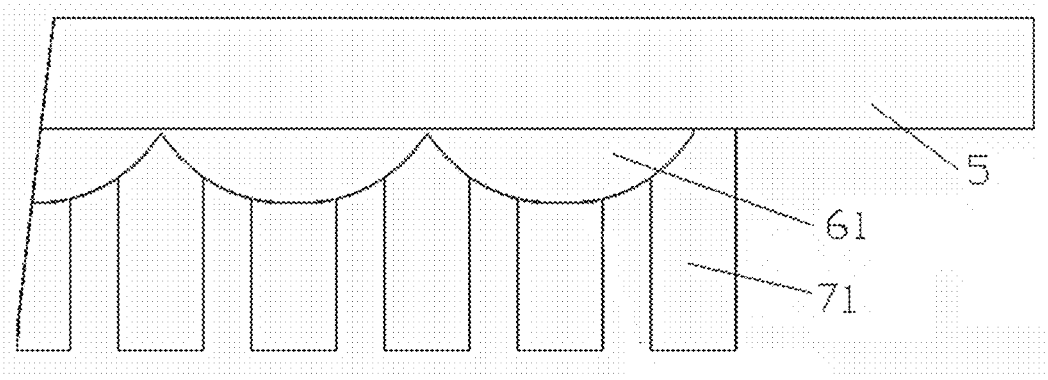
FIG. 11 is a schematic diagram illustrating a fifth arrangement of straight ribs and pin ribs in the heat dissipation structure.

As shown in FIG. 11, the straight ribs 61 of the cooling structure are convex arc-shaped in cross-section and are arranged without gaps on the bottom surface of the cooling plate body 5 along the extending direction. A pin rib 71 is arranged on a top of a convex surface, and another pin rib 71 is arranged at a side of the convex surface.

Figure 12:
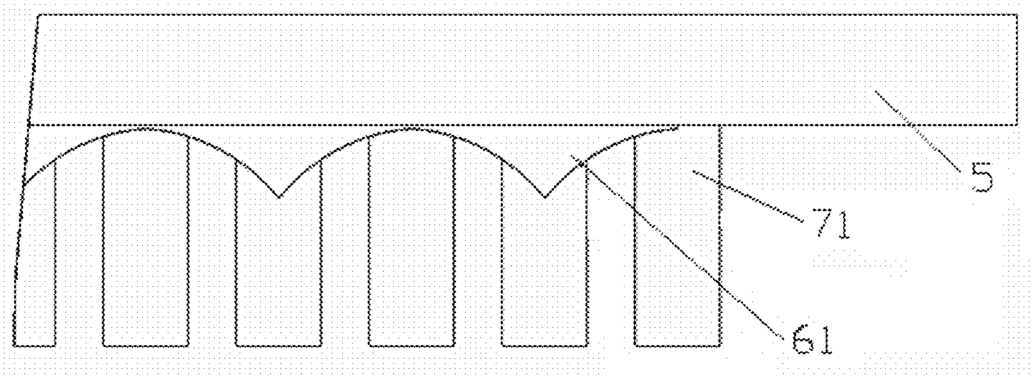
FIG. 12 is a schematic diagram illustrating a sixth arrangement of straight ribs and pin ribs in the heat dissipation structure.

As shown in FIG. 12, the straight ribs 61 of the cooling structure are concave arc-shaped in cross-section and are arranged without gaps on the bottom surface of the cooling plate body 5 along the extending direction. A pin rib 71 is arranged on a bottom of a concave surface, and another pin rib 71 is arranged at a side of the concave surface.

Figure 13:
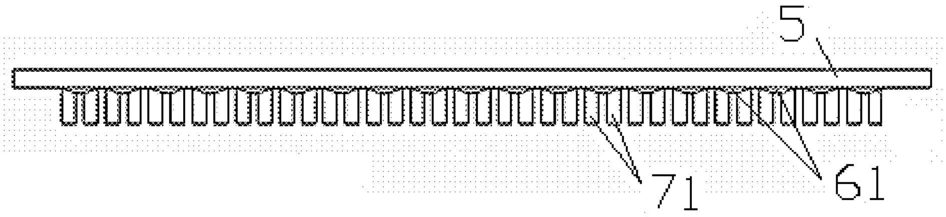
FIG. 13 is a schematic diagram illustrating the heat dissipation structure in which straight ribs are arranged at intervals along an extending direction and pin ribs are arranged on side surfaces of the straight ribs.
Figure 14:
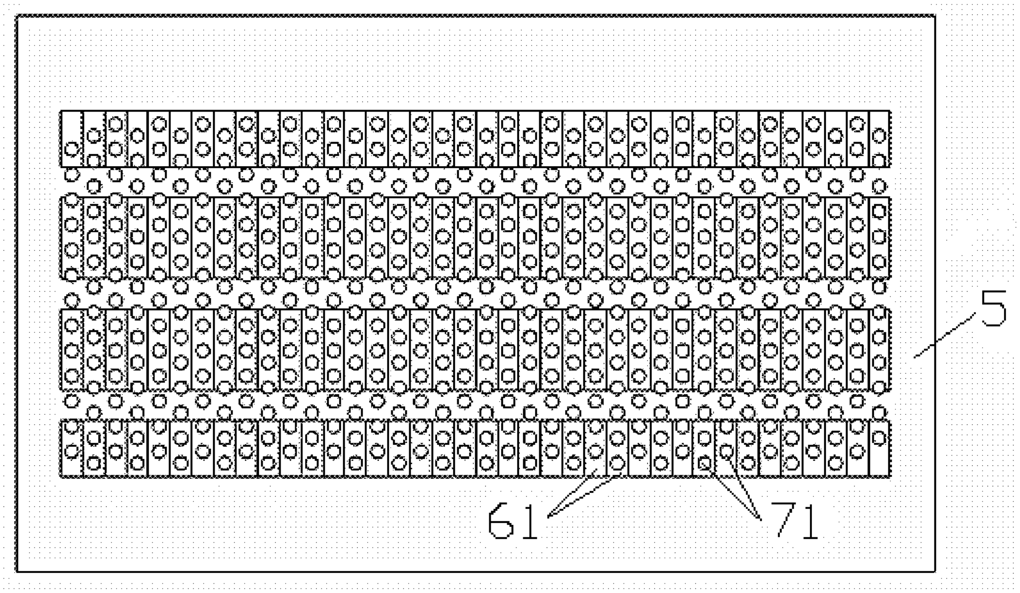
FIG. 14 is a bottom view of the heat dissipation structure in FIG. 13.

As shown in FIGS. 13 and 14, the straight ribs 61 of the cooling structure are triangular in cross-section and are arranged at intervals on the bottom surface of the cooling plate body 5 along the extending direction. The pin rib 71 is arranged on a side surface of the straight rib 61.

Figure 15:
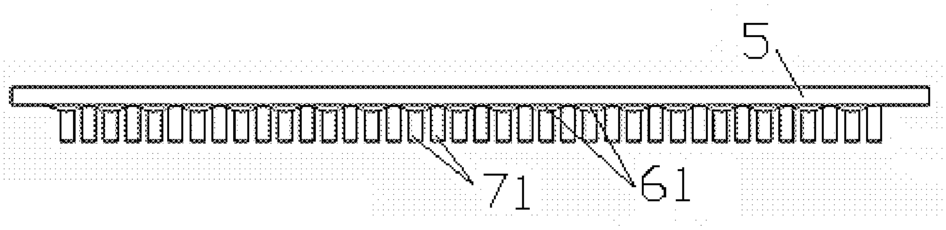
FIG. 15 is a schematic diagram illustrating the heat dissipation structure in which straight ribs are arranged at intervals along an extending direction and pin ribs are arranged on rib bases and rib tops of the straight ribs.
Figure 16:
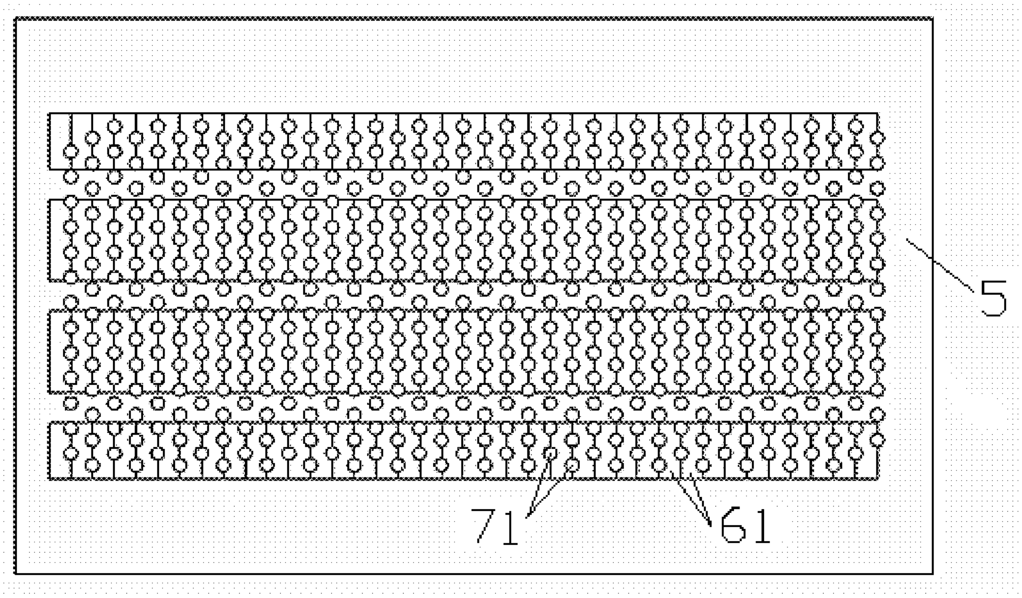
FIG. 16 is a bottom view of the heat dissipation structure in FIG. 15.

As shown in FIGS. 15 and 16, the straight ribs 61 of the cooling structure are triangular in cross-section and are arranged at intervals on the bottom surface of the cooling plate body 5 along the extending direction. A pin rib 71 is arranged on a rib base of the straight rib 61, and another pin rib 71 is arranged on a rib top of the straight rib 61.

Figure 17:
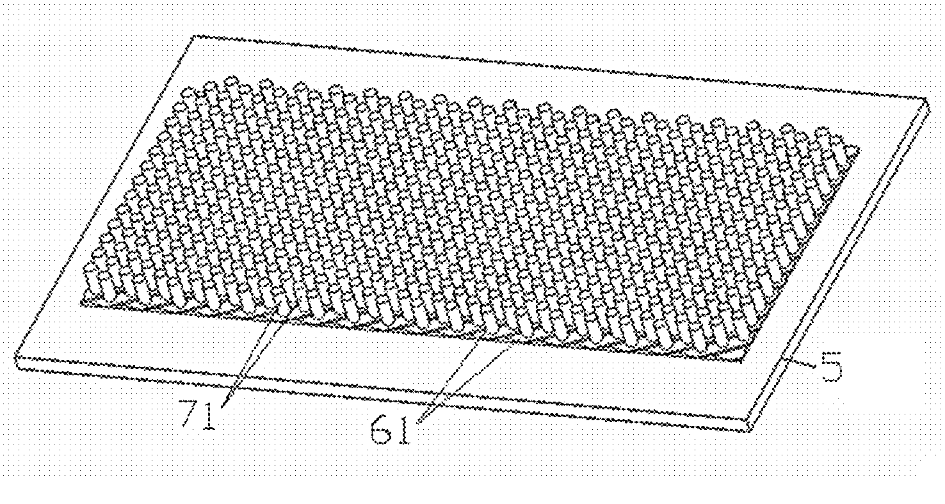
FIG. 17 is a schematic diagram illustrating the heat dissipation structure in which straight ribs are arranged at an angle with a flow direction of coolant.

As shown in FIG. 17, the straight ribs 61 of the cooling structure are triangular in cross-section and are arranged without gaps on the bottom surface of the cooling plate body 5 along the extending direction. A pin rib 71 is arranged on a rib base of the straight rib 61, and another pin rib 71 is arranged on a rib top of the straight rib 61. Each of the straight rib 61 is arranged at an angle with a flow direction of the coolant in the direction along which the bottom surface of the cooling plate body 5 extends.

Figure 18:
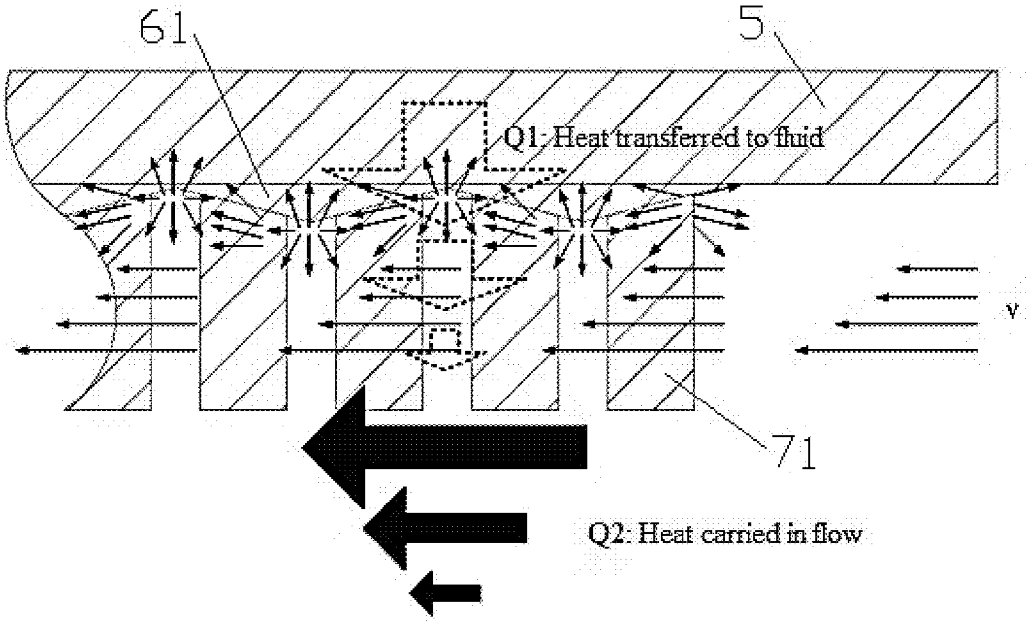
FIG. 18 is a schematic diagram illustrating heat dissipation mechanism of the heat dissipation structure.
Figure 19:
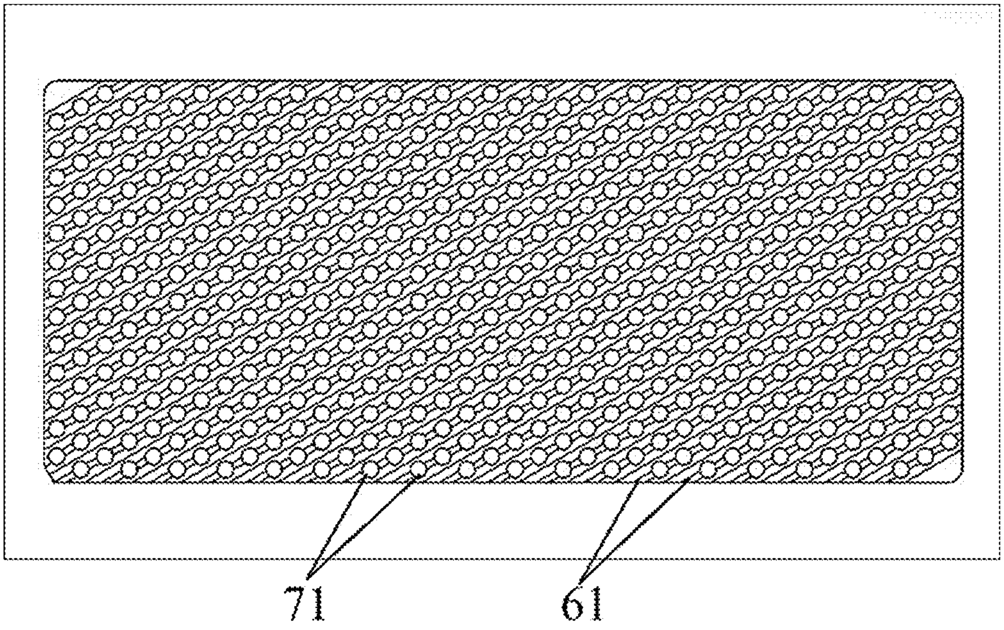
FIG. 19 is a schematic diagram of a heat dissipation structure in which straight ribs are arranged at an angle relative to a flow direction of coolant.

As shown in FIG. 18, with the heat dissipation structure, the convective heat transfer coefficient h and the heat transfer area A are increased with regard to the defects of the conventional technology, so that the heat dissipation capability of the cooling plate 5 is significantly enhanced.

According to Equation (1), the amount of heat carried away by convective heat transfer between the cooling plate 5 and the coolant is:

$$\Phi'=h'\eta A'\Delta T \tag{2}$$

In Equation (2), η is the total efficiency of rib surfaces of the heat dissipation structure of the cooling plate, Φ', h', and A' are the amount of heat carried away by the convective heat transfer, the convective heat transfer coefficient and the total heat dissipation area corresponding to the cooling plate provided with ribs, respectively.

According to the convective heat transfer theory, due to the straight ribs 61 and the pin ribs 71, the fluid switches from the laminar flow to the turbulent flow at the interface between fluid and solid, and the convective heat transfer coefficient h' in the turbulent flow is significantly larger than that in the laminar flow, thereby increasing the amount of heat $Q_2$ transferred by the macroscopic flow of the fluid, which outperforms the conventional technology. In addition, the heat dissipation area of the interface between fluid and solid of the heat dissipation structure is significantly increased, thereby increasing the amount of heat $Q_1$ transferred by the heat conduction of the molecules in the fluid. Therefore, the amount of heat Φ' carried away through the convective heat exchange of the heat dissipation structure is significantly larger than that in the conventional technology, thereby effectively enhancing the heat dissipation capability of the cooling plate.

As shown in FIG. 18, due to the combination of the straight ribs and pin ribs in the cooling structure, the fluid micelles at the interface between fluid and solid not only moves in the main direction, but also pulsate irregularly. When the fluid micelles pulsate from one position to another, vigorous mixing occurs between the fluid micelles, and additional heat exchange occurs between the fluid in the layers at different temperatures. That is, the coolant at the interface between fluid and solid switches from the laminar flow to the turbulent flow. The convective heat transfer coefficient h' in the turbulent flow is significantly larger than that in the laminar flow, which increases the amount of heat $Q_2$ transferred by the macroscopic flow of the fluid. In addition, with the heat dissipation structure, the heat dissipation area of the interface between fluid and solid is significantly increased, thereby increasing the amount of heat $Q_1$ transferred by the heat conduction of the molecules in the fluid. The use of the heat dissipation structure significantly enhances the heat dissipation performance of the power semiconductor module, improves the thermal reliability of the power semiconductor module, significantly reduces the comprehensive cost for heat dissipation of the power semiconductor module, and improves the service life of the power semiconductor module.

The invention claimed is:

1. A heat dissipation structure of a cooling plate for a power semiconductor module, comprising: a power chip, a first solder layer, a copper-clad ceramic substrate, a second solder layer and a cooling plate body which are arranged in a sequence from top to bottom, wherein the heat dissipation structure further comprises a straight rib mechanism and a pin rib mechanism, the straight rib mechanism is arranged on a bottom surface of the cooling plate body, and the pin rib mechanism is arranged on a surface of the straight rib mechanism;

the straight rib mechanism comprises a plurality of straight ribs arranged on the bottom surface of the cooling plate body, each of the plurality of straight ribs has a cross-section that is concave arc-shaped, the pin rib mechanism comprises a plurality of pin ribs arranged on rib bases, rib tops or side surfaces of the plurality of straight ribs; and the arrangement of the plurality of straight ribs on the bottom surface of the cooling plate body is of no gaps.

2. The heat dissipation structure of a cooling plate for a power semiconductor module according to claim 1, wherein the plurality of straight ribs on the bottom surface of the cooling plate body is arranged at an angle of 0 to 90 degrees relative to a flow direction of coolant.

3. The heat dissipation structure of a cooling plate for a power semiconductor module according to claim 2, wherein the plurality of pin ribs is arranged in at least one row between adjacent rib bases or adjacent rib tops of the plurality of straight ribs.

4. The heat dissipation structure of a cooling plate for a power semiconductor module according to claim 2, wherein each of the plurality of pin ribs has a cross-section that is circular, elliptical or polygonal.

5. The heat dissipation structure of a cooling plate of a power semiconductor module according to claim 4, wherein the plurality of pin ribs is arranged in a straight line along the flow direction of the coolant; or the plurality of pin ribs are staggered along the flow direction of the coolant.

6. The heat dissipation structure of a cooling plate for a power semiconductor module according to claim 4, wherein the plurality of pin ribs is arranged in at least one row between adjacent rib bases or adjacent rib tops of the plurality of straight ribs.

* * * * *